(12) United States Patent
Miyazawa

(10) Patent No.: US 9,354,269 B2
(45) Date of Patent: May 31, 2016

(54) SEMICONDUCTOR DEVICE AND METHOD OF DETECTING WIRE OPEN FAILURE THEREOF

(71) Applicant: FUJI ELECTRIC CO., LTD., Kawasaki-shi (JP)

(72) Inventor: Shigemi Miyazawa, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 537 days.

(21) Appl. No.: 13/964,501

(22) Filed: Aug. 12, 2013

(65) Prior Publication Data
US 2014/0070839 A1    Mar. 13, 2014

(30) Foreign Application Priority Data

Sep. 13, 2012  (JP) ................................. 2012-201593

(51) Int. Cl.
*G01R 31/02*  (2006.01)
*G01R 31/26*  (2014.01)
*H01L 29/739*  (2006.01)
(Continued)

(52) U.S. Cl.
CPC .......... *G01R 31/2632* (2013.01); *G01R 31/006* (2013.01); *G01R 31/026* (2013.01); *G01R 31/2637* (2013.01); *H01L 28/20* (2013.01); *H01L 29/41741* (2013.01); *H01L 29/7395* (2013.01); *G01R 31/327* (2013.01); *H01L 29/42372* (2013.01); *H01L 29/42376* (2013.01); *H01L 29/866* (2013.01); *H01L 2224/0603* (2013.01); *H01L 2224/48247* (2013.01); *H01L 2224/49113* (2013.01); *H01L 2924/13055* (2013.01)

(58) Field of Classification Search
CPC ............. G01R 31/2632; G01R 31/006; G01R 31/026; G01R 31/2637; H01L 28/20; H01L 29/41741; H01L 29/7395
See application file for complete search history.

(56) References Cited

U.S. PATENT DOCUMENTS 5,877,419 A *  3/1999  Farokhzad ......... G01R 31/2608
                                                         324/762.08

FOREIGN PATENT DOCUMENTS

JP    09-266226 A   10/1997
JP    11-111785 A    4/1999

OTHER PUBLICATIONS

Mingxing et al., Condition Monitoring IGBT Module Bond Wire Liftoff Using Measurable Signals, 2012 IEEE 7th International Power Electronics and Motion Control Conference—ECCE Asia, Jun. 2-5, 2012, Harbin, China.*
Lehmann et al., Method for Electrical Detection of Bond Wire Lift-Off for Power Semiconductors, ISPSD 2003, Apr. 14-17, Cambridge, UK.*

(Continued)

*Primary Examiner* — Daniel Miller
(74) *Attorney, Agent, or Firm* — Rabin & Berdo, P.C.

(57) ABSTRACT

In a semiconductor device, two series connections are arranged to be connected between respective split emitter electrodes and a gate electrode with Zener diode units connected in series to respective resistors, with the cathode sides thereof directed to the gate electrode side. The numbers of the Zener diodes in the Zener diode units in the respective series connections are different between the respective Zener diode units. Thus, a semiconductor device can be provided which is capable of detecting an open failure of a bonding wire regardless of the number of a plurality of the bonding wires connected in parallel, by a simple electrical test to make it possible to reliably sort out a semiconductor device with a wire open failure at an early stage.

12 Claims, 16 Drawing Sheets

| (51) | Int. Cl. | |
|---|---|---|
| | *G01R 31/00* | (2006.01) |
| | *H01L 49/02* | (2006.01) |
| | *H01L 29/417* | (2006.01) |
| | *H01L 29/866* | (2006.01) |
| | *G01R 31/327* | (2006.01) |
| | *H01L 29/423* | (2006.01) |

(56) References Cited

OTHER PUBLICATIONS

Farokhzad et al, Reliability Indicators for Lift-Off of Bond Wires in IGBT Power-Modules, Microelectron. Reliab., vol. 36, No. 11/12, pp. 1863-1866, 1996.*

* cited by examiner

SEMICONDUCTOR DEVICE AND METHOD OF DETECTING WIRE OPEN FAILURE THEREOF

BACKGROUND OF THE INVENTION

1. Field of the Invention

The present invention relates to a semiconductor device used for a switching device for carrying out on-off control of a current flowing in an electric circuit and a method of detecting a wire open failure of the semiconductor device. The invention particularly relates to a semiconductor device controlling a large current like an ignition semiconductor device for an automobile internal combustion engine.

2. Background Art

For an ignition system for an automobile internal combustion engine, a power semiconductor device is used which carries out, for example, switching control of a primary current of an ignition coil. FIG. 9 is a circuit diagram showing an example of a configuration of a common ignition system for an automobile internal combustion engine using an IGBT (Insulated Gate Bipolar Transistor) for such a power semiconductor device.

The ignition system for automobile internal combustion engine shown in FIG. 9 is formed of an engine control unit (hereinafter referred to as an ECU) 901, an ignition IGBT 902 as a related ignition IGBT, an ignition coil unit 903, a voltage source 904 and a spark plug 905.

The related ignition IGBT 902 has three electrodes of a collector electrode C connected to the ignition coil unit 903, an emitter electrode E connected to the ground, and a gate electrode G connected to the ECU 901. Between the gate electrode G and the emitter electrode E, a bidirectional Zener diode 908 is connected that protects the gate of an IGBT 909 in case a surge voltage exceeding the breakdown voltage of the Zener diode is inputted to the gate electrode G.

Here, an operation of the ignition system for automobile internal combustion engine shown in FIG. 9 will be briefly explained. The ECU 901 outputs a signal to the gate electrode G for controlling the switching (turning-on and -off) of the ignition IGBT 902. For example, a signal of 5V outputted to the gate electrode G brings the IGBT 909 to be turned-on and a signal of 0V outputted to the gate electrode G brings the IGBT 909 to be turned-off.

First, a turning-on signal outputted from the ECU 901 to the G terminal brings the ignition IGBT 902 to be turned-on, which allows a corrector current (hereinafter referred to as an Ic) to begin to flow from the voltage source 904 (at 14V, for example) to the collector electrode C of the ignition IGBT 902 through a primary coil 906 of the ignition coil unit 903. A rate of change of the Ic with respect to time t expressed as dIc/dt is determined by the inductance of the primary coil 906 and an applied voltage. Subsequent to this, a turning-off signal outputted from the ECU 901 to the G terminal makes the ignition IGBT 902 turned-off to abruptly decrease the Ic. The abrupt change in the Ic abruptly increases the voltage across the primary coil 906. At the same time, the voltage across a secondary coil 907 also increases up to tens of kilovolts (30 kV, for example). The increased voltage is applied to the spark plug 905. The spark plug 905 produces a spark at approximately 10 kv or more of an applied voltage.

The related ignition IGBT 902, on which previously explained switching control is carried out, will be explained with reference to FIGS. 14A and 14B. FIG. 14A is a circuit diagram again showing the configuration of the related ignition IGBT 902 shown in FIG. 9 and FIG. 14B is a plan view showing the related ignition IGBT 902 with resin for encapsulation being removed therefrom. The related ignition IGBT 902 has a structure in which an IGBT chip 1001 is soldered on a C terminal board 1000-1(a) of a lead frame 1000 with the collector electrode C on the bottom surface side down. The gate electrode G on the top surface side of the IGBT chip 1001 is connected to an external G terminal board 1000-2 by bonding with a metal wire 1003 and the emitter electrode E on the top surface side of the IGBT chip 1001 is connected to an external E terminal board 1000-3 by bonding with another metal wire 1003. A bidirectional Zener diode ZD, connected between the gate electrode G and the emitter electrode E of the IGBT chip 1001, is formed in a polysilicon layer layered on the surface of the IGBT chip 1001 with an oxide film in between. From one side of the C terminal board 1000-1(a) forming the lead frame 1000, an external C terminal board 1000-1(b) is extended for connecting the C terminal board 1000-1(a) to the outside. Furthermore, the IGBT chip 1001 and the wire bonded part at one end of each of the external terminal boards are sealed so as to be covered with unillustrated molding resin. The other end of each of the external terminal boards protrudes outside of the molding resin to be exposed.

When a large current flows in an IGBT like the ignition IGBT 902, the IGBT chip 1001 generates heat due to on-state resistance. Moreover, the metal wire 1003, connecting the surface of the emitter electrode E of the IGBT chip 1001 and the surface of the external E terminal board 1000-3, generates heat due to the electric resistance thereof.

Moreover, as the electric resistance of the metal wire 1003 becomes larger, a power loss due to the current flowing in the metal wire 1003 becomes larger. In addition, as the inductance of the metal wire 1003 becomes larger, the metal wire 1003 becomes more liable to cause an oscillation. Hence, it is desirable for the metal wire 1003 to have the smallest possible electric resistance and inductance. In general, the electric resistance of a metal wire can be decreased by increasing the diameter of the metal wire. However, there is a limit in the diameter of a metal wire that allows the metal wire to be reliably connected by bonding. Thus, it is impossible to further decrease the electric resistance of the metal wire by increasing the diameter of the metal wire more than the limit.

Therefore, even in an actual related ignition IGBT, a connection structure, in which an emitter electrode of an IGBT chip and an external E terminal board are connected with a plurality of metal wires arranged in parallel by bonding, is commonly adopted for minimizing heat generating factors such as electric resistance, thermal resistance and inductance when a current is made to flow in the metal wire. FIG. 13A is a plan view showing a related ignition IGBT similar to the related ignition IGBT shown in FIG. 14B with resin for encapsulation being removed therefrom, in which the emitter electrode E of the IGBT chip 1001 and the external E terminal board 1000-3 are connected by a single metal wire 1003. FIG. 13B is a plan view showing a related ignition IGBT with resin for encapsulation being removed therefrom in which the emitter electrode E and the external E terminal board 1000-3 of the IGBT chip 1001 shown in FIG. 13A are connected by a plurality of metal wires 1003 arranged in parallel.

The ignition IGBT with such a connection structure of the metal wires passes an early stage electrical factory test carried out prior to shipment even though a part of a plurality of the metal wires 1003 are opened (by breaking of wire, for example) and is to be put on the market. However, breaking in a part of a plurality of the bonded metal wires in parallel connection causes an increase in a current density per one metal wire to increase heat generation, by which temperatures of the metal wire itself, a section of connecting the metal wire and the semiconductor chip by bonding and the semiconductor chip itself become high to increase possibilities of causing problems in durability and long-term reliability. A product of a device, having such a high possibility of causing deterioration or degradation in durability and reliability thereof even though it has passed an early stage electrical factory test carried out prior to shipment, is unfavorable as a product in a field where a requirement for high reliability is particularly severe like a vehicle-mounted component. Hence, such a product of a device must be reliably sorted out as a faulty component in an electrical factory test at an early stage. The connection structure, having wire open failures with a part of a plurality of metal wires 1003 opened as was explained in the foregoing, is considered to be caused by defects such as faulty solderless connection at bonding and breaking due to a mechanical or electrical cause.

With respect to a method of reliably detecting wire open failure in a power semiconductor device, having a structure in which a plurality of metal wires arranged in parallel are connected by bonding, in an early stage electrical factory test carried out prior to shipment, documents with descriptions like those in the following have been already known publicly. For example, in JP-A-9-266226, it is described that in a semiconductor device with a number of unit cells arranged in parallel on a semiconductor substrate, a configuration is provided in which at least one of the main electrode regions of the semiconductor device is split into two or more individual bonding pad regions and, to a bonding pad in each of the regions, an individual bonding wire is connected with one end thereof, and the other end of the bonding wire is connected to a common external terminal. By measuring the on-state resistance of the semiconductor device, wire open failure of the device can be detected.

Moreover, in JP-A-11-111785, a wire open detecting system is described in which a plurality of first pads, being in correspondence with a plurality of their respective device cells, are connected to a single first lead (terminal) with a plurality of wires the number of which is the same as that of the first pads, the first pads are further connected to a single second pad for the wire open failure detection through their respective resistors, and the second pad is connected to a single second lead (terminal) for the wire open detection with a wire. In the wire open detecting system, wire open failure can be detected by a change in the resistance value between the first lead and the second lead.

Patent Document 1: JP-A-9-266226
Patent Document 2: JP-A-11-111785

The method disclosed in JP-A-9-266226 is a method of detecting a wire open failure by measuring the on-state resistance of a device and the method disclosed in JP-A-11-111785 is a method of detecting a wire open failure by measuring the variation in the resistance value between the single first lead (terminal), to which a plurality of device cells are connected through their respective wires, and the single second lead (terminal), to which the wires are connected through their respective resistors.

The method of detecting a wire open failure disclosed in each of JP-A-9-266226 and JP-A-11-111785 detects wires with open failures by the change in resistance value depending on the number of wires with open failures. Thus, although the methods can detect the number of wires with open failures, it is difficult for the methods to identify the wire with an open failure. Furthermore, the amount of change in resistance value due to an open failure decreases with an increase in the number of wires. This causes the change in resistance value due to the wire open failure to become equal to or less than the range of variation in resistance values among the semiconductor devices, which sometimes makes the detection of open failure difficult.

The invention was made with the problems explained in the foregoing taken into consideration. It is an object of the invention to provide a semiconductor device which is capable of detecting an open failure of a bonding wire regardless of the number of a plurality of the bonding wires connected in parallel by a simple electrical test to make it possible to reliably sort out a semiconductor device with a wire open failure at an early stage, and a method of detecting a wire open failure.

SUMMARY OF THE INVENTION

For achieving the object of the invention, the semiconductor device according to the invention includes a semiconductor substrate having a plurality of unit cells therein, a plurality of split output main electrodes provided on the one side of the semiconductor substrate, each of the split output main electrodes being arranged so as to be in contact with surfaces of output regions of a specified number of unit cells of a plurality of the unit cells, a control electrode arranged on the one side of the semiconductor substrate while being connected to each of control regions of a plurality of the unit cells, an input main electrode arranged on the other side of the semiconductor substrate, an external output terminal, a plurality of metal wires each being connected to the surface of its own one of a plurality of the split output main electrodes with the one end thereof and to the surface of the external output terminal with the other end thereof by bonding, and a plurality of Zener diode and resistor series connections arranged to be connected between their respective ones of a plurality of the split output main electrodes and the control electrode, each with a Zener diode unit of at least one Zener diode being connected in series to a resistor with the cathode sides thereof directed to the control electrode side, and the numbers of the Zener diodes in the Zener diode units in the respective series connections being given in ascending order from at least one.

For such a device, a configuration may be provided in which at least the Zener diode and resistor series connection with the Zener diode unit of one Zener diode has a bidirectional Zener diode connected thereto in parallel.

Moreover, it is desirable that the semiconductor device is an ignition IGBT semiconductor device mounted on an ignition system for an automobile internal combustion engine.

In addition, for achieving the object of the invention, a method of detecting a wire open failure in the foregoing semiconductor device is provided as a detecting method including the steps of increasing a voltage applied to the external output terminal with the control electrode being grounded, measuring electrical resistance between the external output terminal and the control electrode, and checking the number of times that the electric resistances vary and the order in which the electric resistances vary for each of the voltages as multiples of the built-in potential of the p-n junction of a Zener diode, the multiples being proportional to the numbers of the Zener diodes in the Zener diode units in the respective Zener diode and resistor series connections.

According to the invention, a semiconductor device can be provided which is capable of detecting an open failure of a bonding wire regardless of the number of a plurality of the bonding wires connected in parallel by a simple electrical test to make it possible to reliably sort out a semiconductor device

DETAILED DESCRIPTION

Figure 1:
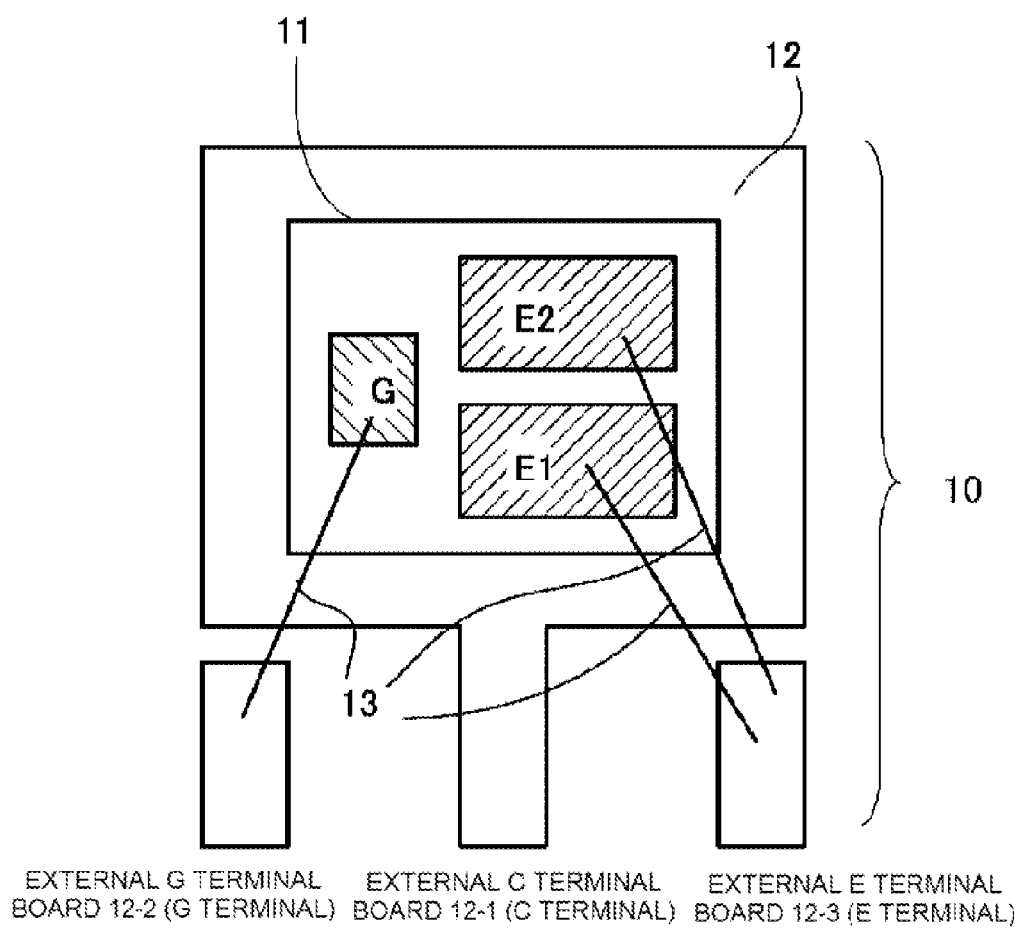
FIG. 1 is a plan view showing the principal part of an ignition IGBT according to example 1 of the invention with resin for encapsulation being removed therefrom.

In the following, examples of a semiconductor device and examples of a method of detecting a wire open failure according to the invention will be explained in detail with reference to attached drawings. In the specification and the attached drawings, a leading character "n" or "p" attached to each of names of layers and regions means that carriers are electrons or holes, respectively, in the layers and the regions. Moreover, a sign "+" or "−" attached to each of the leading characters "n" and "p" represents that the impurity concentration is relatively higher or lower, respectively. Furthermore, in the attached drawings, similar arrangements will be denoted with the same reference numerals and signs with redundant explanations thereof being omitted. In addition, in the attached drawings with reference to which the example will be explained are drawn neither to an accurate scale nor with an accurate dimensional proportion for the purpose of making the drawn items easy to see and easy to understand. Additionally, in the following explanations, although a term "Zener diode" is used for each of semiconductor devices referred to as "Zener diodes" according to a commonly called term, the device is not necessarily described while being clearly distinguished from a common diode. The term "Zener diode" only means that the device is not a high voltage diode with a breakdown voltage of hundreds of volts or more. Thus, the term "Zener diode" can be simply substituted by a term "diode". Further, the invention is not limited to the descriptions of the examples explained in the following, but is susceptible to various modifications, changes and adaptations without departing from the spirit and scope of the invention.

Example 1

An ignition IGBT mounted in an ignition system for an automobile internal combustion engine will be explained in the following as a semiconductor device according to the example 1 of the invention.

FIG. 1 is a plan view showing the principal part of an ignition IGBT according to the example 1 of the invention with resin for encapsulation being removed therefrom. The ignition IGBT has an IGBT chip 11 soldered on the top surface of a C terminal board 12 (also referred to as a C terminal) of a lead frame 10 with a collector electrode C as an input main electrode on the bottom surface side down. On the top surface side of the IGBT chip 11, there are provided a gate electrode G as a control electrode and split emitter electrodes E1 and E2 as split output main electrodes to which an emitter electrode as an output main electrode is split into two. The IGBT chip 11 has a specified number of IGBT unit cells each formed by combining separately formed impurity diffused layers, and each of the split emitter electrodes E1 and E2 contacts its own specified number of IGBT unit cells. Furthermore, the surface of each of the split emitter electrodes E1 and E2 and the surface of an external E terminal board 12-3 (also referred to as an E terminal) are connected by carrying out bonding of a metal wire 13. In addition, the surface of the gate electrode G and the surface of an external G terminal board 12-2 (also referred to as a G terminal) are also connected by carrying out bonding of the metal wire 13. The collector electrode C on the bottom side of the IGBT chip is not split but is made to be in ohmic contact with the surface of a collector layer of the silicon substrate with a continuous one-piece metal film to be soldered onto the surface of the C terminal board 12 as was explained in the foregoing.

Figure 2:
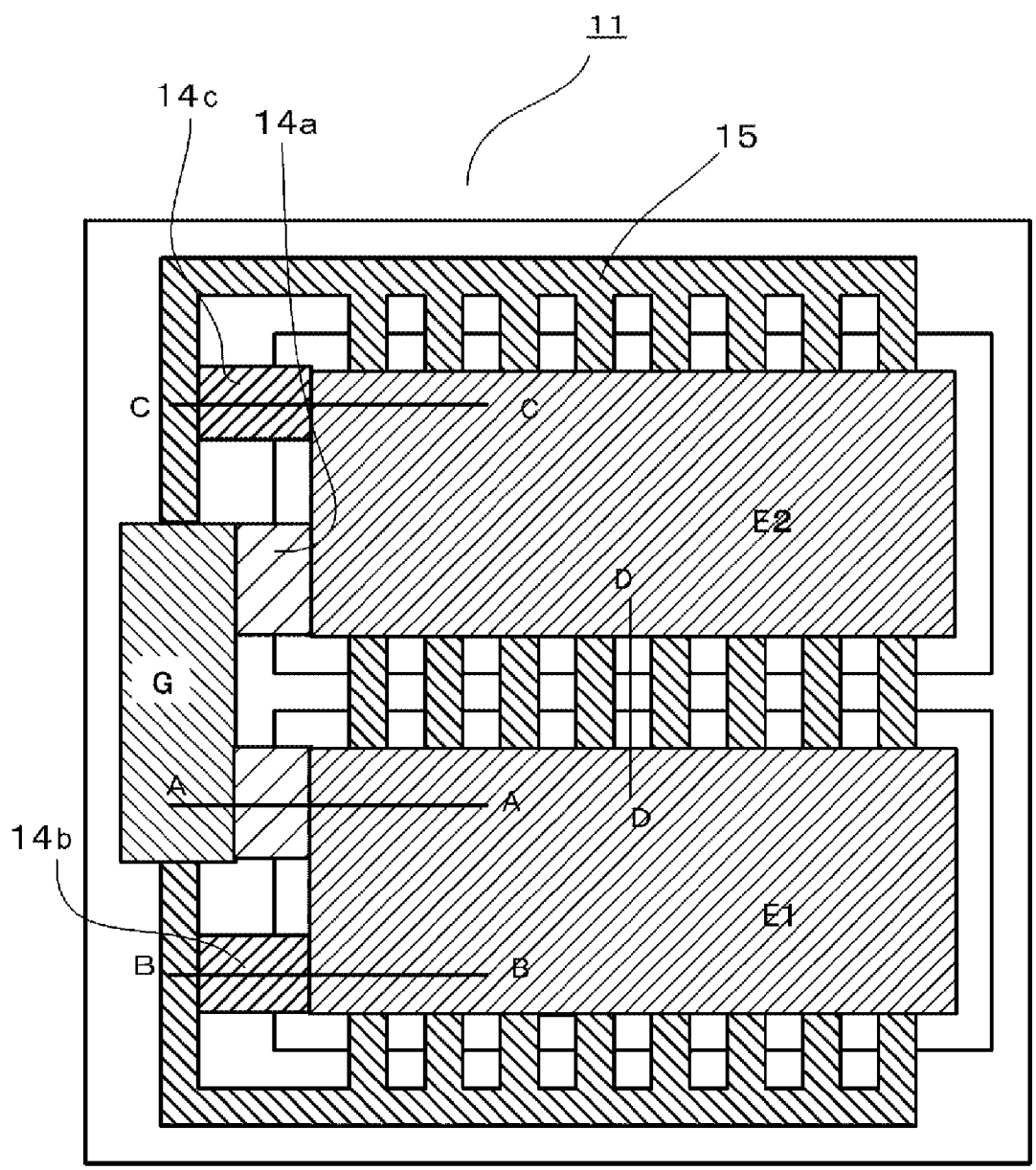
FIG. 2 is an enlarged plan view showing details of the IGBT chip mounted on the ignition IGBT shown in FIG. 1.

FIG. 2 is an enlarged plan view showing details of the IGBT chip 11 mounted on the ignition IGBT shown in FIG. 1. Between the split emitter electrode E1 and the gate electrode G, a polysilicon bidirectional Zener diode 14a is connected and, between the split emitter electrode E2 and the gate electrode G, a polysilicon bidirectional Zener diode 14a is also connected. Reference numeral 15 denotes a polysilicon wiring layer extended from a polysilicon gate electrode in each of the IGBT unit cells to be connected to the pad of the gate electrode G. Between the split emitter electrode E1 and the polysilicon wiring layer 15, a polysilicon Zener diode and polysilicon resistor series connection 14b is connected and, between the split emitter electrode E2 and the polysilicon wiring layer 15, a series connection 14c of the polysilicon Zener diode and polysilicon resistor series connection 14b and a polysilicon Zener diode is connected. FIG. 3, FIG. 4, FIG. 5 and FIG. 6 are cross sectional views taken along line A-A, line B-B, line C-C and line D-D, respectively, of FIG. 2. FIG. 7 is a circuit diagram showing the equivalent circuit of the IGBT chip shown in FIG. 2.

Figure 3:
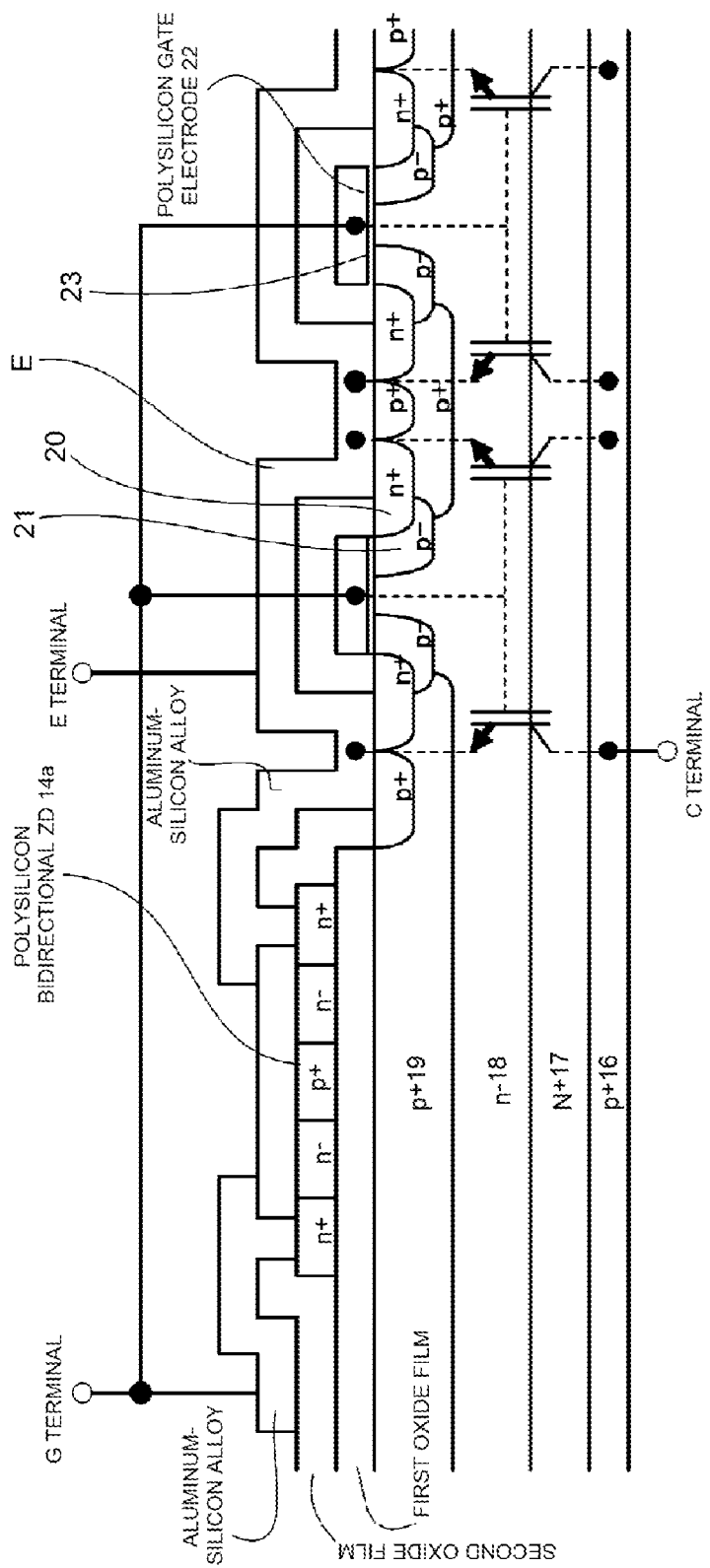
FIG. 3 is a cross sectional view taken along line A-A of FIG. 2.

As is shown in FIG. 3 as the cross sectional view of the IGBT chip 11 taken along line A-A of FIG. 2, the polysilicon bidirectional Zener diode 14a is provided by forming specified p-layer and n-layer with selective implantation of specified donor ions and accepter ions into a polysilicon layer formed on the surface of a silicon substrate of the IGBT with a first oxide film in between. By connecting the split emitter electrode E1 of an Al—Si alloy to an $n^+$-layer at one end on the split emitter electrode E1 side of the polysilicon bidirectional Zener diode 14a through a contact hole opened in a second oxide film and, by connecting the pad of the gate electrode G of an Al—Si alloy to an $n^+$-layer at the other end on the gate electrode G side, the polysilicon bidirectional Zener diode 14a is reliably connected between the gate electrode G and the split emitter electrode E1. The layer structure in the silicon substrate will be explained later. Wiring drawn in FIG. 3 by a solid line connecting a polysilicon gate electrode 22 in each of the IGBT unit cells to the G terminal shows that the unillustrated polysilicon wiring layer 15, extended from the polysilicon gate electrode 22, is provided as wiring on the top surface of the silicon substrate to be connected to the G terminal. The polysilicon wiring layer 15, being provided as a plane pattern, is not shown in the cross sectional view of FIG. 3, but is shown in the plan view of FIG. 2.

Figure 4:
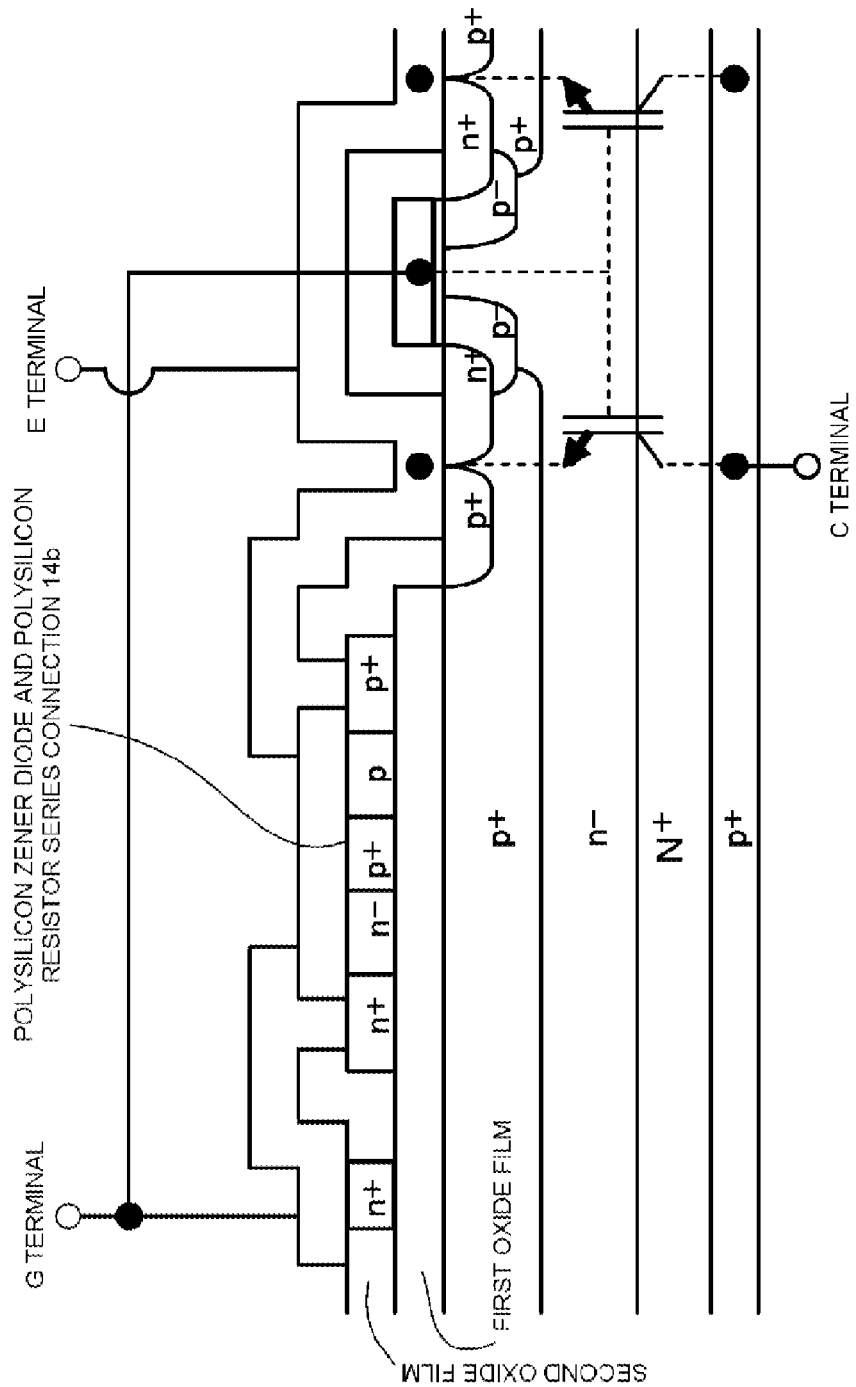
FIG. 4 is a cross sectional view taken along line B-B of FIG. 2.

As is shown in FIG. 4 as the cross sectional view taken along line B-B of FIG. 2, a polysilicon Zener diode is formed by carrying out selective implantation of donor ions and accepter ions into a polysilicon layer formed on the surface of the silicon substrate of the IGBT with the first oxide film in between. Along with this, a region subjected to no ion implantation (p-region) is formed to be provided as a polysilicon resistor. Thus, the polysilicon Zener diode and polysilicon resistor series connection 14b of a polysilicon Zener diode and a polysilicon resistor (p-region) is to be formed in the polysilicon layer. A $p^+$-layer at one end on the split emitter electrode E1 side of the polysilicon layer as the polysilicon Zener diode and polysilicon resistor series connection 14b is connected to the split emitter electrode E1 of an Al—Si alloy through a contact hole opened in the second oxide film. Along with this, an $n^+$-layer at the other end on the polysilicon wiring layer 15 side is connected to the polysilicon wiring layer 15, which is connected to the G terminal through another contact hole opened in the second oxide film. Hence, a Zener diode unit 71 as a polysilicon Zener diode and a resistor 72 are connected in series between the gate electrode G and the split emitter electrode E1 as is shown in the equivalent circuit in FIG. 7.

Figure 5:
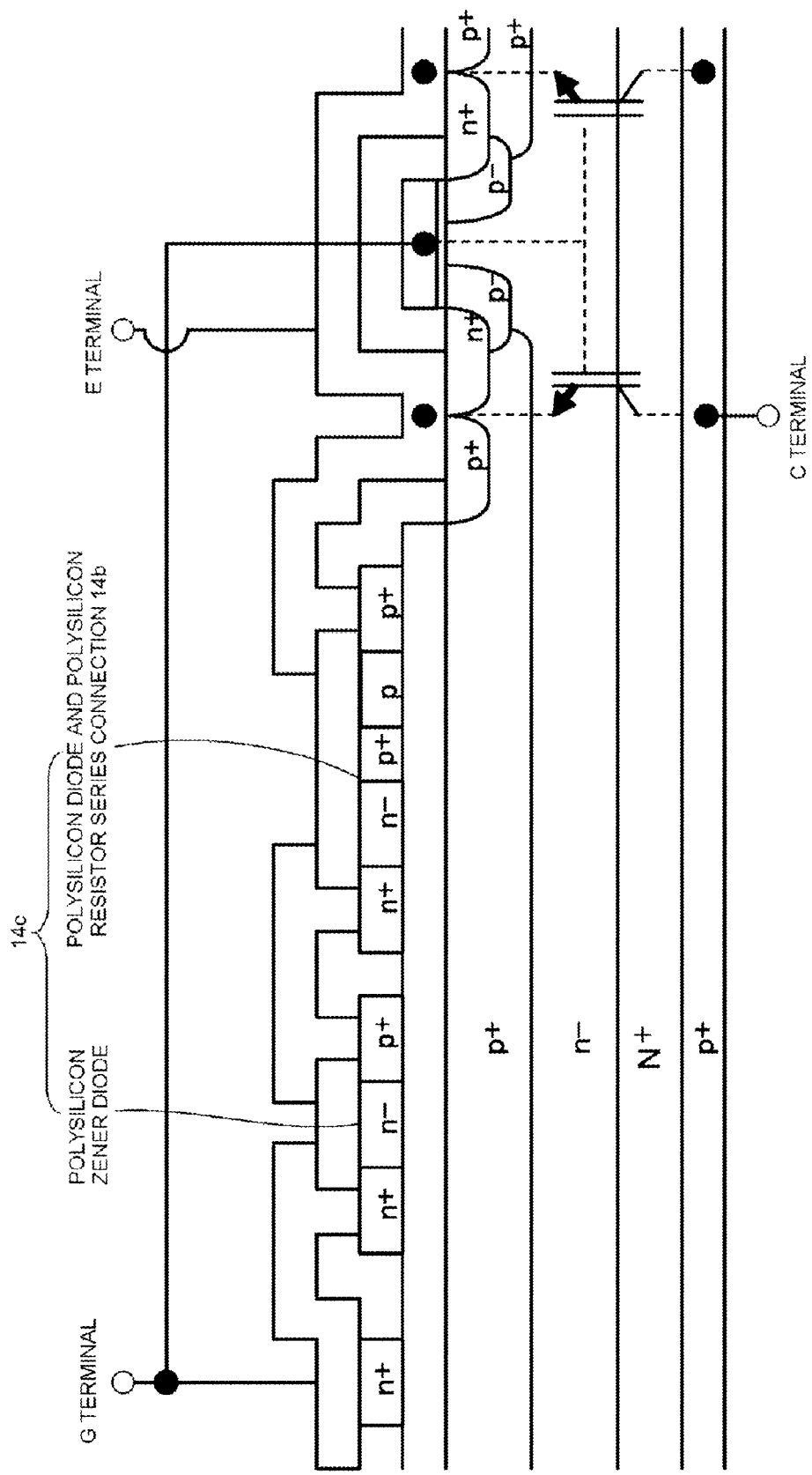
FIG. 5 is a cross sectional view taken along line C-C of FIG. 2.

In FIG. 5 as the cross sectional view taken along line C-C of FIG. 2, it is shown that a series connection, having one more polysilicon Zener diode added to the polysilicon Zener diode and polysilicon resistor series connection 14c connected between the G terminal and the E1 terminal shown in FIG. 4, is connected between the polysilicon wiring layer 15 connected to the G terminal and the split emitter electrode E2. This is the configuration of a series connection with a series connection of a Zener diode unit 74 as a two-in-series polysilicon Zener diode and a resistor 75 provided between the G terminal and the E2 terminal in the equivalent circuit shown in FIG. 7.

Figure 6:
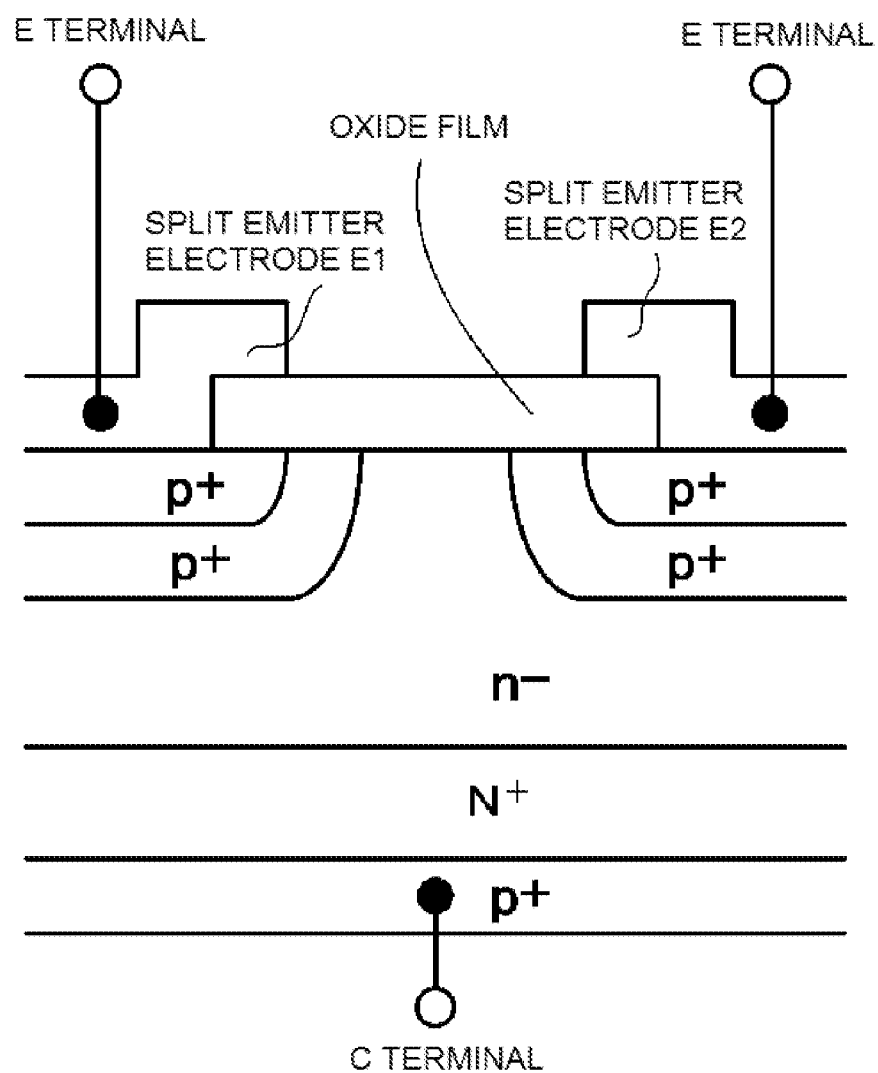
FIG. 6 is a cross sectional views taken along line D-D of FIG. 2.
Figure 7:
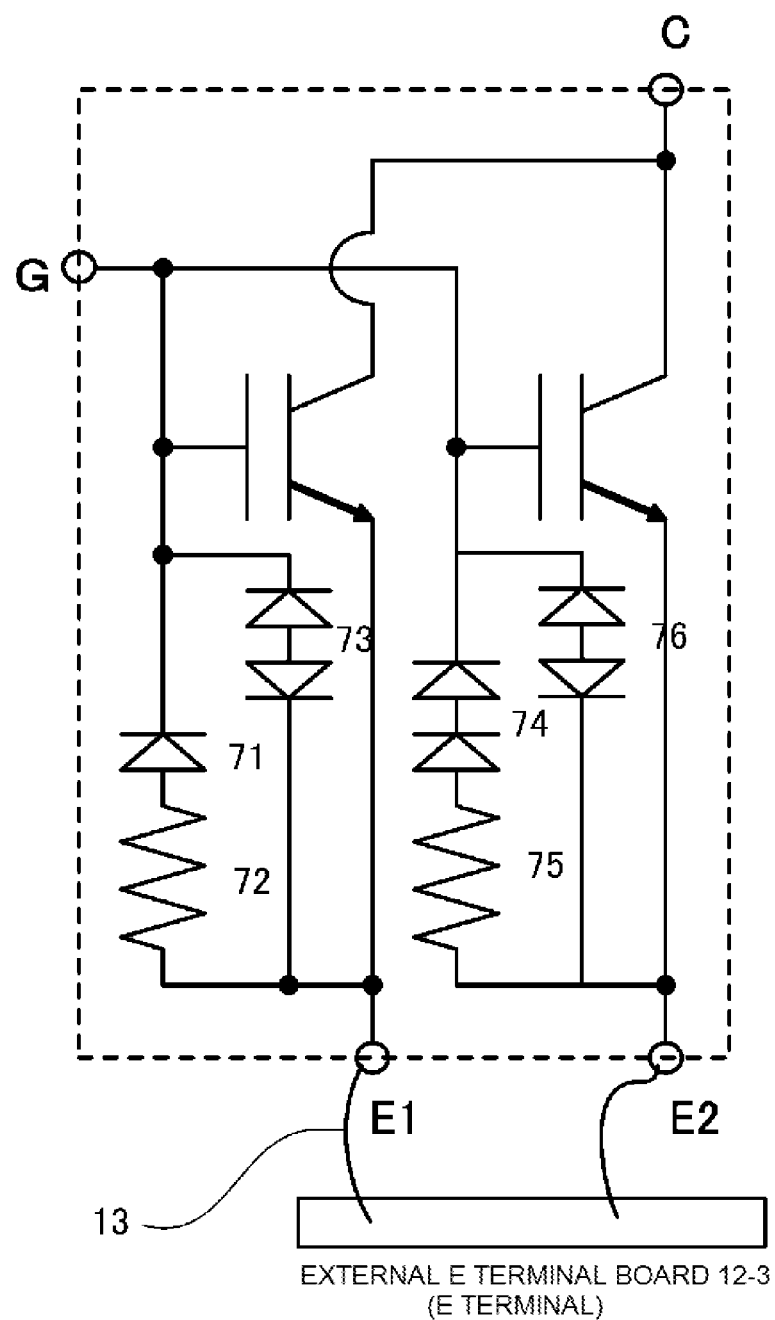
FIG. 7 is a circuit diagram showing the equivalent circuit of the IGBT chip shown in FIG. 2.

In FIG. 6 as the cross sectional view taken along line D-D of FIG. 2, it is shown that on the surface side of the silicon substrate, two $p^+$-regions in the silicon substrate surface being in surface contact with the split emitter electrodes E1 and E2, respectively, are isolated by an oxide film provided between the two $p^+$-regions.

In the following, a method of fabricating the IGBT chip shown in FIG. 2 will be explained with reference to FIG. 2 to FIG. 7. On a $p^+$-silicon substrate 16, an $n^+$-layer 17 and an $n^-$-layer 18 are formed in the order by epitaxy. In the $n^-$-layer 18, a plurality of $p^+$-regions 19 are selectively formed by ion implantation and thermal diffusion. Then, an emitter region 20 as an output region is formed along the boundary of the plane pattern of each of the $p^+$-regions 19. In each region on the surface of the $n^-$-layer 18 between the $p^+$-regions 19 adjacent to each other with a spacing being left, a polysilicon gate electrode 22 of conductive polysilicon is formed with a gate insulator 23 provided in between to provide a control region. On the surface of the $n^-$-layer 18, the polysilicon wiring layer 15, reaching the pad of the gate electrode G of Al—Si alloy, is further formed as an extension of the polysilicon gate electrode 22 on the gate insulator 23. With the polysilicon gate electrode 22 used as a mask, $p^-$-regions 21 are formed in the $n^-$-layer 18 by ion implantation and thermal diffusion to be provided as channel forming regions. After this, a first oxide film is formed on the surface of the silicon substrate with the polysilicon gate electrodes 22 and the polysilicon wiring layer 15 formed thereon except sections between the polysilicon gate electrodes 22 and the section on the outer periphery of each of the polysilicon gate electrodes 22. Then, with the first oxide film on each of the polysilicon gate electrodes 22 used as a mask, ion implantation is selectively carried on both sides thereof to form $p^+$ and $n^+$ regions, on which Al—Si alloy films contacting thereto are formed to be provided as the split emitter electrodes E1 and E2. Moreover, on the surface of the silicon substrate except the active region of the IGBT, two polysilicon layers are formed each with the first oxide film in between. In each of the polysilicon layers, two $n^+$-regions, two $n^-$regions and a $p^+$-region are formed by carrying out selective ion implantation with donor ions and acceptor ions to be provided as the polysilicon bidirectional Zener diode (ZD) 14a. On the polysilicon bidirectional Zener diode (ZD) 14a, a second oxide film is formed, on which an Al—Si alloy electrode is provided to be formed as the pad of the gate electrode G. In the second oxide film on the $n^+$-region at each end of each of the polysilicon bidirectional Zener diodes 14a, a contact hole is formed. The $n^+$-region at one end is connected to each of the split emitter electrodes E1 and E2 by an Al—Si alloy wiring through the one contact hole, and the $n^+$-region at the other end is connected to the pad of the gate electrode G by an Al—Si alloy wiring through the other contact hole.

In FIG. 7 as the equivalent circuit diagram of the IGBT chip 11 shown in FIG. 2, between the gate electrode G and the split emitter electrode E1, a Zener diode unit 71 and a polysilicon resistor 72 are connected in series, which correspond to the polysilicon Zener diode and polysilicon resistor series connection 14b formed in the polysilicon layer as shown in FIG. 4. In parallel to the series connection, a bidirectional Zener diode 73 is connected, which corresponds to the polysilicon bidirectional Zener diode 14a also formed in the polysilicon layer as shown in FIG. 3. In the same way, between the gate electrode G and the split emitter electrode E2, the Zener diode unit 74 as the two-in-series polysilicon Zener diode and the polysilicon resistor 75 are connected in series, which correspond to the series connection 14c of the polysilicon Zener diode and polysilicon resistor series connection 14b and a Zener diode formed in the polysilicon layer as shown in FIG. 5. In parallel to the series connection, a bidirectional Zener diode 76 is connected, which is equivalent to the bidirectional Zener diode 14a shown in FIG. 3. The split emitter electrode E1 and the split emitter electrode E2 are connected to the external E terminal board 12-3 with metal wires 13 by bonding.

Figure 8:
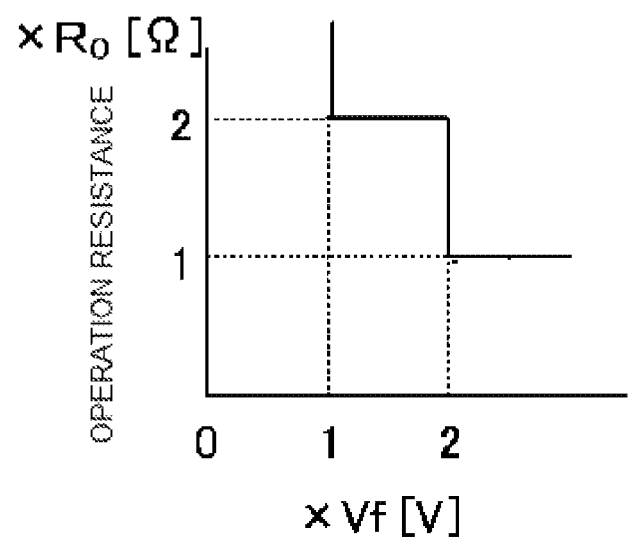
FIG. 8 is a diagram showing a relation between the emitter-gate voltage and the operating resistance of the IGBT chip according to example 1 of the invention shown in FIG. 7 in a method according to the invention of detecting a bonding wire open failure in the IGBT chip mounted on an ignition IGBT.
Figure 9:
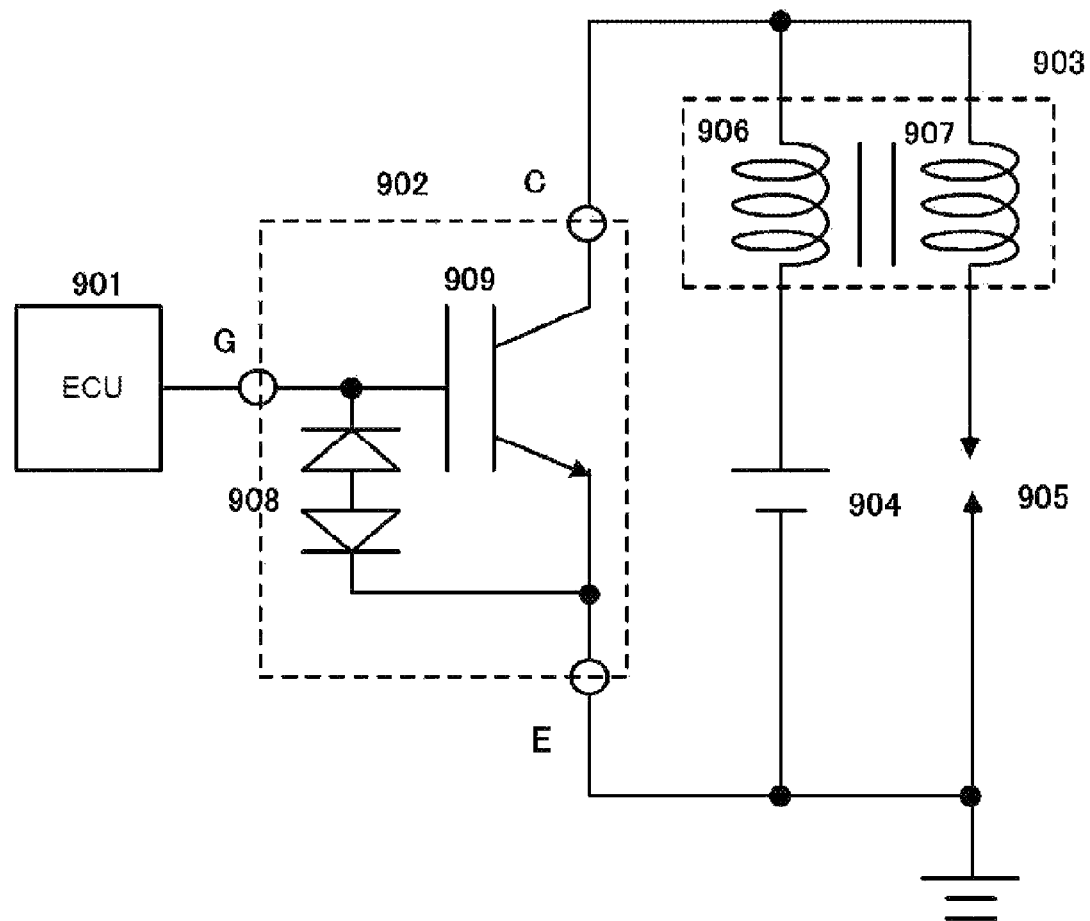
FIG. 9 is a circuit diagram showing an example of a configuration of a common ignition system for an automobile internal combustion engine using an IGBT for a power semiconductor device.

FIG. 8 is a diagram showing a relation between the emitter-gate voltage and the operating resistance of the IGBT chip according to example 1 of the invention shown in FIG. 7 in a method according to the invention of detecting a bonding wire open failure in the IGBT chip mounted on an ignition IGBT. In the diagram, a resistance value between the emitter and the gate with respect to an applied voltage is shown when the gate electrode G of the IGBT chip shown in FIG. 7 is grounded through the external G terminal board 12-2 (G terminal) and a positive voltage is applied to the split emitter electrode E1 and the split emitter electrode E2 through the external E terminal board 12-3 (E terminal).

In the following, the method of detecting a wire open failure will be explained. As is shown in FIG. 8, a voltage with a value as a multiple of the forward built-in potential difference Vf at the p-n junction in the polysilicon Zener diode forming the Zener diode unit 71 is to be applied to the E terminal. The forward built-in potential difference Vf is sometimes referred to as a barrier potential difference. In the polysilicon Zener diode forming the Zener diode unit 71, an applied forward voltage exceeding Vf (ordinarily on the order of 0.7V) initiates a flow of a current in the direction from the split emitter electrode E1 to the gate electrode G (the forward direction of the diode). Letting the resistance value of the polysilicon resistor 72 be 2 $R_0$, the resistance value between the E terminal and the G terminal in this case becomes 2 $R_0$. Further increase in the voltage applied to the E terminal, although the voltage value less than two times of Vf provides the resistance value still at 2 $R_0$ as the resistance value of the polysilicon resistor 72, also initiates a flow of a current from the split emitter electrode E2 to the gate electrode G when the value of the voltage applied to the E terminal exceeds two times of Vf. The resistance value in this case becomes $R_0$ as the resistance value of the parallel connection of the polysilicon resistor 72 (resistance value 2 $R_0$) and the polysilicon resistor 75 (resistance value 2 $R_0$).

Both of the two metal wires 13 connected to the split emitter electrode E1 and the split emitter electrode E2, respectively, are connected to the external E terminal board 12-3. Hence, when the voltage applied to the external E terminal board 12-3 is varied from zero to the value exceeding two times of Vf with the G terminal being grounded, the resistance value varies in two steps as is shown in FIG. 8. However, when either of the metal wires is opened (broken), the resistance value varies only in one step, by which the presence or absence of wire open can be determined. Moreover, by the magnitude of the voltage when the value of the operating resistance varies, it can be known which one of the metal wires connected to the split emitter electrodes E1 and E2 is broken.

Example 2

Figure 10:
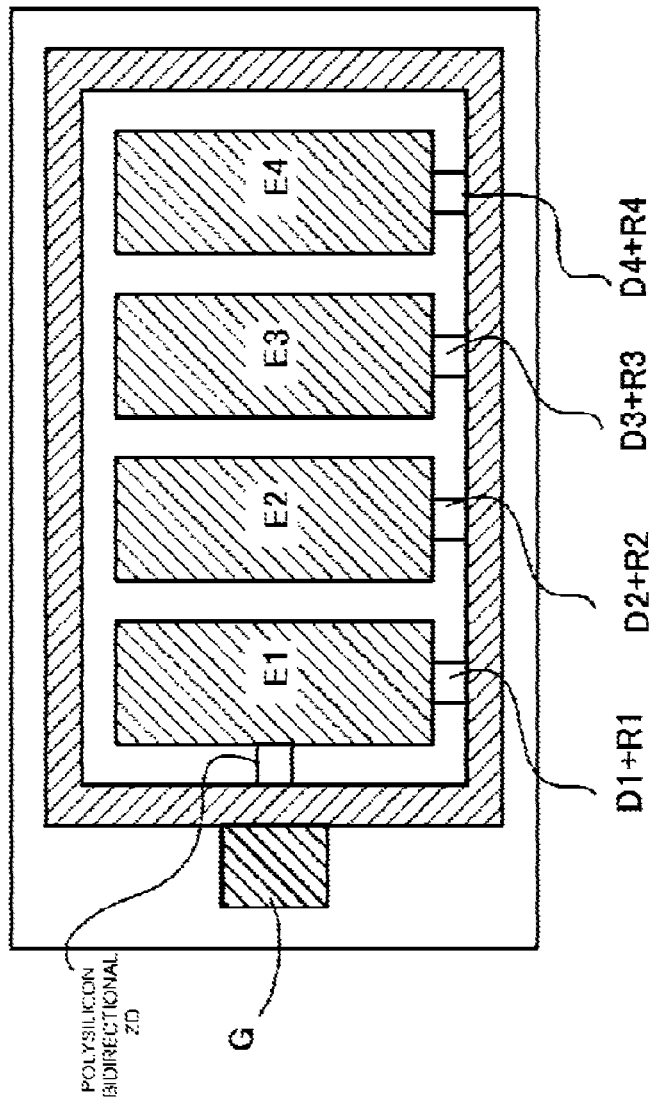
FIG. 10 is an enlarged plan view showing an IGBT chip according to example 2 of the invention mounted on the ignition IGBT.
Figure 11:
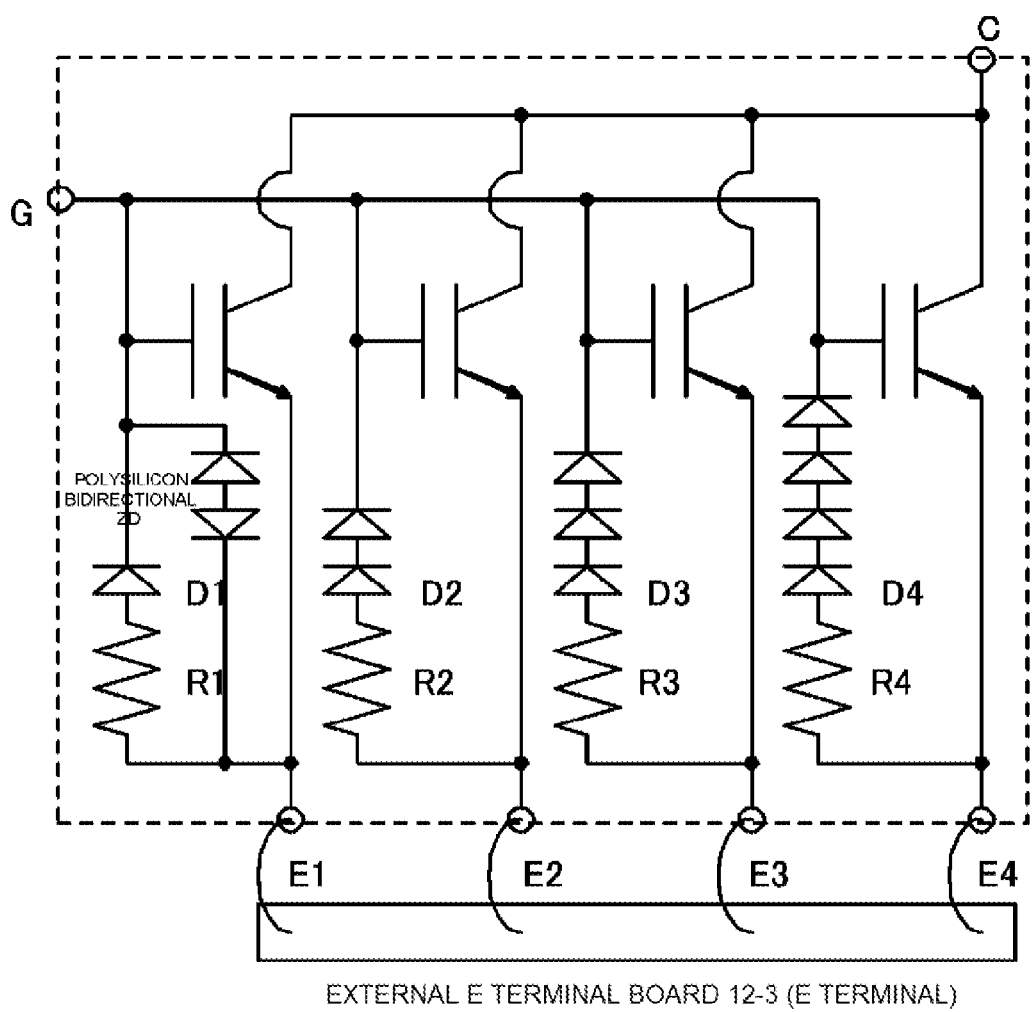
FIG. 11 is a circuit diagram showing an equivalent circuit of the IGBT chip shown in FIG. 10.

FIG. 10 is an enlarged plan view showing an IGBT chip according to example 2 of the invention mounted on an ignition IGBT. In example 2, like the IGBT chip according to example 1 of the invention shown in FIG. 2, the emitter electrode of the IGBT chip is split into four as split emitter electrodes E1, E2, E3, and E4. The IGBT chip shown in FIG. 10 will be explained. FIG. 11 is a circuit diagram showing an equivalent circuit of the IGBT chip shown in FIG. 10.

As is shown in FIG. 11, Zener diode units D1, D2, D3 and D4, together with their respective resistors R1, R2, R3 and R4 being in series connection thereto, are connected between their respective split emitter electrodes E1, E2, E3, and E4 and the gate electrode G in the IGBT chip. The numbers of the Zener diodes in the Zener diode units D1, D2, D3 and D4 in the respective series connections are given in ascending order from one.

Figure 12:
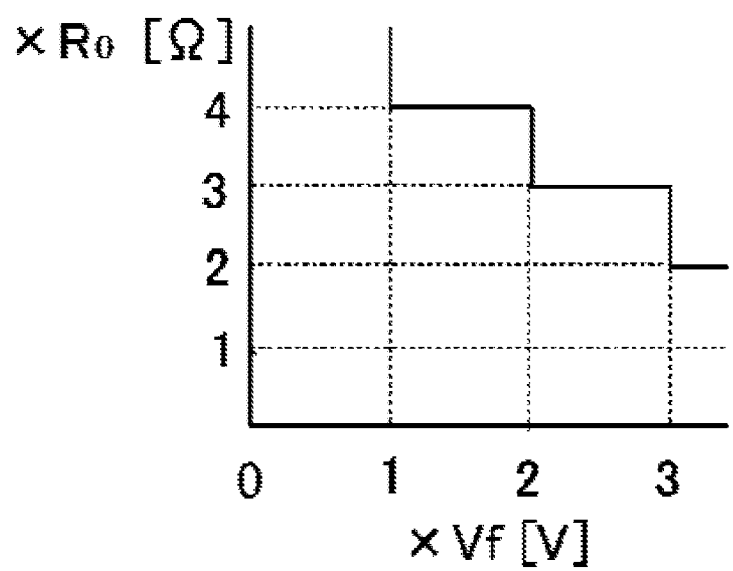
FIG. 12 is a diagram showing a relation between the emitter-gate voltage and the operating resistance of the IGBT chip shown in FIGS. 10 and 11 in a method according to the invention of detecting a bonding wire open failure in the IGBT chip mounted on an ignition IGBT.
Figure 13A:
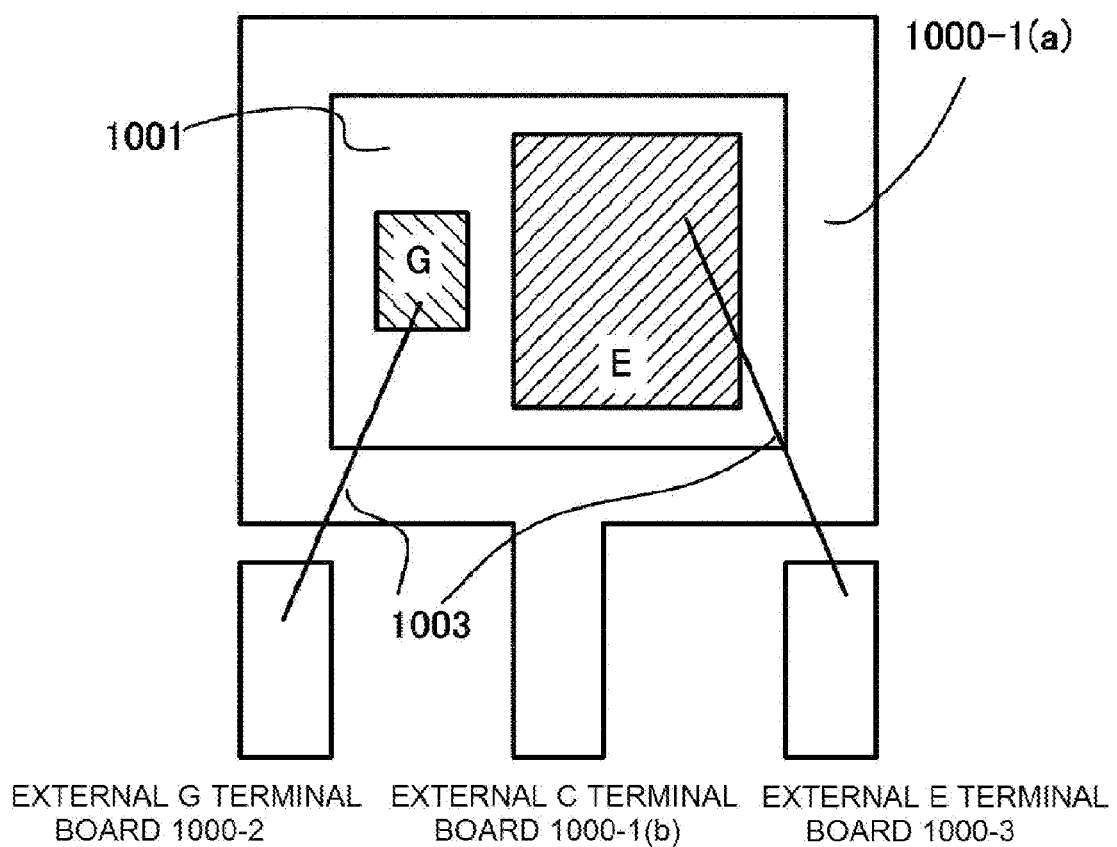
FIG. 13A is a plan view showing a related ignition IGBT similar to the related ignition IGBT shown in FIG. 14B with resin for encapsulation being removed therefrom.
Figure 13B:
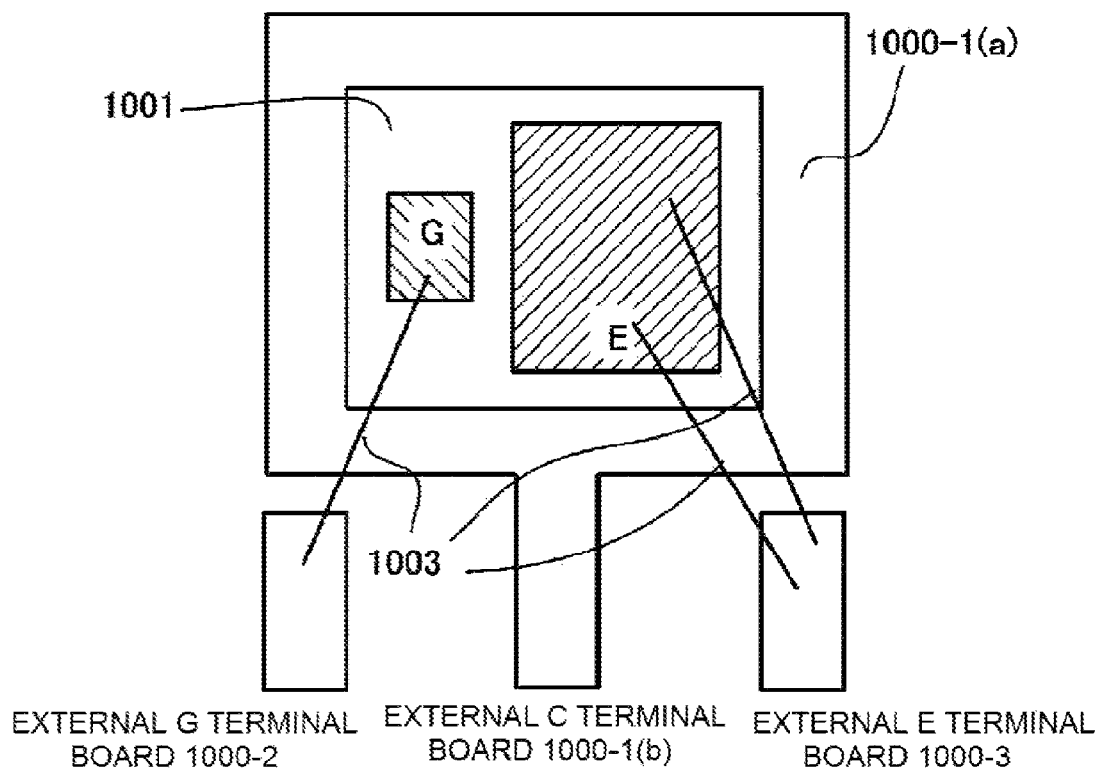
FIG. 13B is a plan view showing a related ignition IGBT with resin for encapsulation being removed therefrom in which the emitter electrode E and the external E terminal board are connected by a plurality of metal wires arranged in parallel.
Figure 14A:
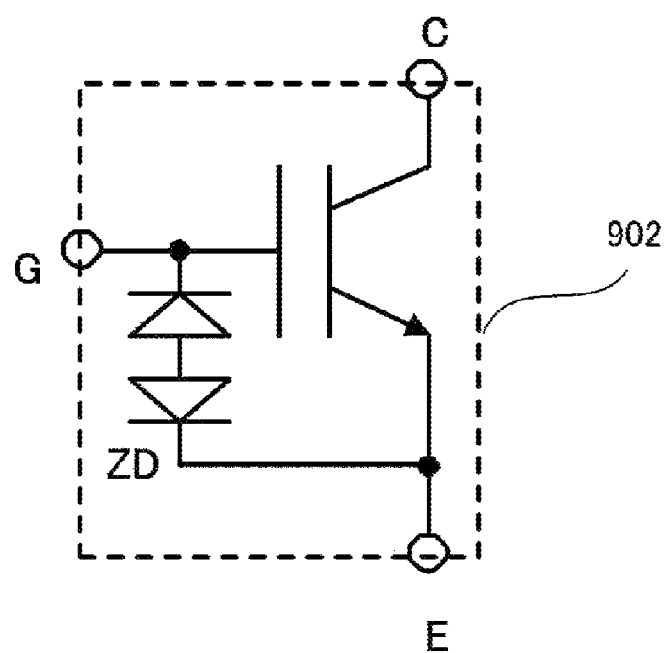
FIG. 14A is a circuit diagram again showing the configuration of the related ignition IGBT shown in FIG. 9.
Figure 14B:
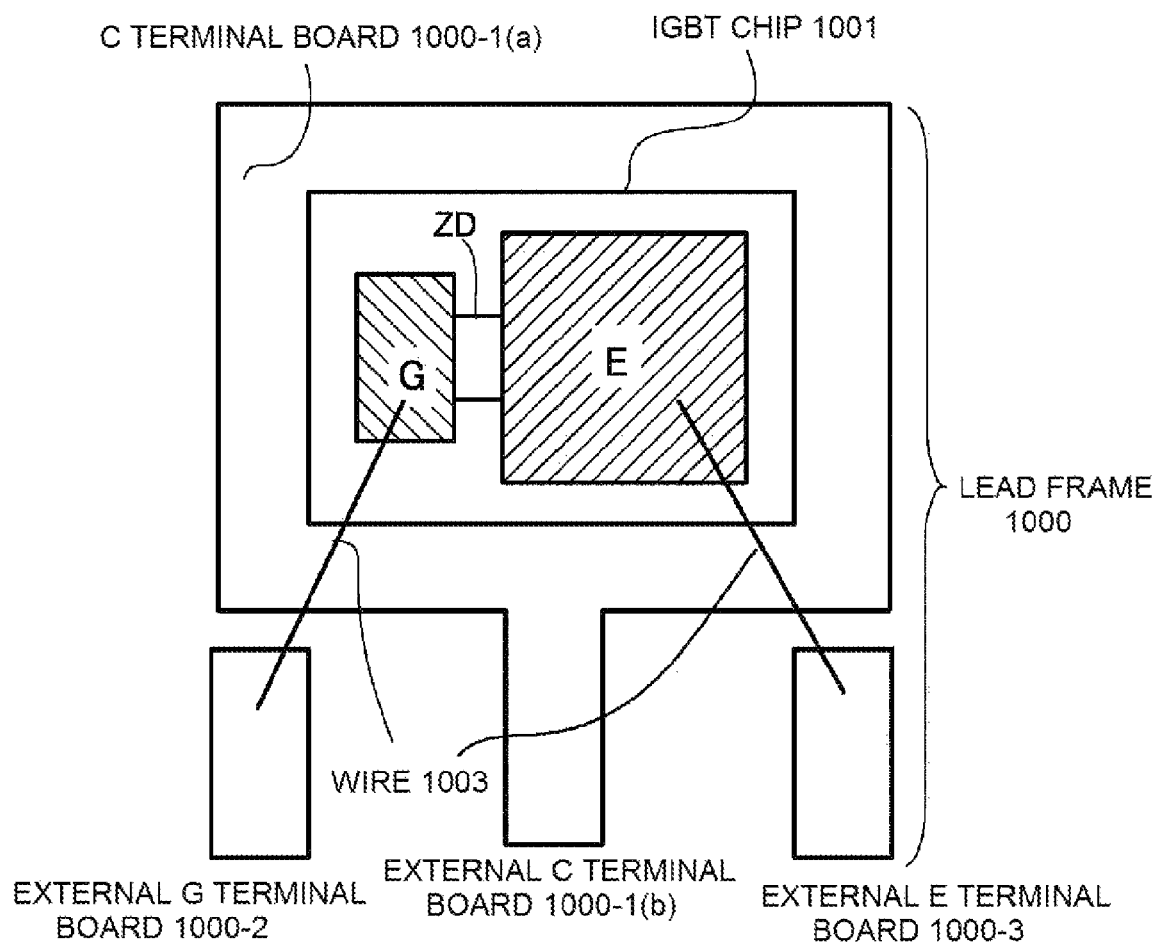
FIG. 14B is a plan view showing the related ignition IGBT with resin for encapsulation being removed therefrom.

FIG. 12 is a diagram showing a relation between the emitter-gate voltage and the operating resistance of the IGBT chip shown in FIGS. 10 and 11 in a method according to the invention of detecting a bonding wire open failure in the IGBT chip mounted on an ignition IGBT. In the diagram, a resistance value between the emitter and the gate with respect to an applied voltage is shown when the gate electrode G shown in FIGS. 10 and 11 is grounded and a positive voltage is applied to the split emitter electrodes E1, E2, E3 and E4 through the external E terminal board 12-3 (E terminal). When a voltage applied to the E terminal exceeds Vf (approximately 0.7V), a current begins to flow between the split emitter electrode E1 and the gate electrode G. Letting the resistance values of the resistors R1, R2, R3 and R4 be 4 $R_0$, 12 $R_0$, 6 $R_0$ and 2 $R_0$, respectively, the operating resistance value at this time is 4 $R_0$, the resistance value of the resistor R1. The application of a voltage exceeding 2Vf(=1.4V) to the E terminal results in the operating resistance value of 3 $R_0$ as the resistance value of the parallel connection of the resistors R1 and R2. The application of a voltage exceeding 3 Vf (=2.1V) to the E terminal results in the operating resistance value of 2 $R_0$ as the resistance value of the parallel connection of the resistors R1, R2 and R3 and the application of a voltage exceeding 4Vf (=2.8V) to the E terminal results in the operating resistance of $R_0$ as the resistance value of the parallel connection of the resistors R1, R2, R3 and R4. By examining the relation between the voltage as a multiple of the forward built-in potential difference Vf and the operating resistance value in this way, a wire open failure can be detected even in the case with a large number of split emitter electrodes.

While the present invention has been particularly shown and described with reference to the preferred embodiment thereof, it will be understood by those skilled in the art that the foregoing and other changes in form and details can be made therein without departing from the spirit and scope of the present invention.

What is claimed is:

1. A semiconductor device comprising:
    a semiconductor substrate having a plurality of unit cells therein;
    a plurality of split output main electrodes provided on one side of the semiconductor substrate, each of the split output main electrodes being arranged so as to be in contact with surfaces of output regions of a specified number of unit cells of a plurality of the unit cells;
    a control electrode arranged on the one side of the semiconductor substrate while being connected to each of control regions of a plurality of the unit cells;
    an input main electrode arranged on another side of the semiconductor substrate;
    an external output terminal;
    a plurality of metal wires each being connected to a surface of one of the plurality of the split output main electrodes with the one end, and to a surface of the external output terminal with another end by bonding; and
    a plurality of Zener diode and resistor series connections arranged to be connected between respective ones of the plurality of the split output main electrodes and the control electrode, each with a Zener diode unit of at least one Zener diode being connected in series to a resistor with cathode sides of the Zener diode unit directed to a control electrode side, numbers of Zener diodes in Zener diode units in the series connections being different between respective Zener diode units.

2. The semiconductor device as claimed in claim 1, wherein at least a Zener diode and resistor series connection of a Zener diode unit has a bidirectional Zener diode connected thereto in parallel.

3. The semiconductor device as claimed in claim 1, wherein the semiconductor device is an ignition IGBT semiconductor device mounted on an ignition system for an automobile internal combustion engine.

4. A method of detecting a wire open failure in the semiconductor device as claimed in claim 1, comprising the steps of:
grounding the control electrode;
applying increasing voltages to the external output terminal;
measuring electrical resistance between the external output terminal and the control electrode; and
checking a number of times that the electric resistance varies and an order in which the electric resistance varies for each of the applied voltages, the voltages being applied as multiples of a built-in potential of a p-n junction of a Zener diode, the multiples being proportional to numbers of the Zener diodes in the Zener diode units.

5. The semiconductor device as claimed in claim 2, wherein the semiconductor device is an ignition IGBT semiconductor device mounted on an ignition system for an automobile internal combustion engine.

6. A method of detecting a wire open failure in the semiconductor device as claimed in claim 2, comprising the steps of:
grounding the control electrode;
applying increasing voltages to the external output terminal;
measuring electrical resistance between the external output terminal and the control electrode; and
checking a number of times that the electric resistance varies and an order in which the electric resistance varies for each of the applied voltages, the voltages being applied as multiples of a built-in potential of a p-n junction of a Zener diode, the multiples being proportional to numbers of the Zener diodes in the Zener diode units.

7. A method of detecting a wire open failure in the semiconductor device as claimed in claim 3, comprising the steps of:
grounding the control electrode;
applying increasing voltages to the external output terminal;
measuring electrical resistance between the external output terminal and the control electrode; and
checking a number of times that the electric resistance varies and an order in which the electric resistance varies for each of the applied voltages, the voltages being applied as multiples of a built-in potential of a p-n junction of a Zener diode, the multiples being proportional to numbers of the Zener diodes in the Zener diode units.

8. A semiconductor device, comprising:
a control electrode;
a plurality of output electrodes; and
a plurality of diode units, each diode unit of the plurality of diode units having a number of diodes different from at least one other diode unit of the plurality of diode units;
wherein each of the diode units is connected between the control electrode and a respective output electrode of the plurality of output electrodes.

9. The semiconductor device of claim 8, wherein the number of diodes increases by one across the plurality of diode units.

10. The semiconductor device of claim 8, wherein in each of the plurality of diode units a resistor is connected in series with the number of diodes.

11. The semiconductor device of claim 8, wherein each of the plurality of output electrodes is connected to a terminal board of an Insulated Gate Bipolar Transistor device.

12. A method comprising,
in a semiconductor device comprising
a control electrode,
a plurality of output electrodes,
a plurality of diode units, each diode unit of the plurality of diode units having a number of diodes different from at least one other diode unit of the plurality of diode units, and
an external output terminal,
wherein each of the diode units is connected in series with a resistor between the control electrode and a respective output electrode of the plurality of output electrodes, and each of the plurality of output electrodes is connected to the external output terminal:
grounding the control electrode;
applying a voltage to the external output terminal;
measuring an electrical resistance between the external output terminal and the control electrode; and
identifying a failure in the semiconductor device based on the applied voltage, the measured electrical resistance, and the number of diodes per diode unit.

* * * * *